(12) United States Patent
Patterson

(10) Patent No.: US 7,298,837 B2
(45) Date of Patent: Nov. 20, 2007

(54) CROSS-OVER VOLTAGE LOCK FOR DIFFERENTIAL OUTPUT DRIVERS

(75) Inventor: James D. Patterson, Colorado Springs, CO (US)

(73) Assignee: Intel Corporation, Santa Clara, CA (US)

( * ) Notice: Subject to any disclaimer, the term of this patent is extended or adjusted under 35 U.S.C. 154(b) by 671 days.

(21) Appl. No.: 10/612,290

(22) Filed: Jun. 30, 2003

(65) Prior Publication Data

US 2004/0263214 A1    Dec. 30, 2004

(51) Int. Cl.
*H04M 1/00* (2006.01)
*H04M 9/00* (2006.01)

(52) U.S. Cl. .................. 379/399.01; 327/65

(58) Field of Classification Search ................. 379/399.01–413.04
See application file for complete search history.

(56) References Cited

U.S. PATENT DOCUMENTS

| | | | | |
|---|---|---|---|---|
| 5,166,635 A | * | 11/1992 | Shih | 330/253 |
| 5,726,588 A | * | 3/1998 | Fiedler | 326/63 |
| 6,018,219 A | * | 1/2000 | Komarek et al. | 315/194 |
| 6,430,606 B1 | * | 8/2002 | Haq | 709/208 |
| 6,566,926 B1 | | 5/2003 | Patterson | 327/206 |
| 6,583,656 B1 | * | 6/2003 | Liu | 327/170 |
| 6,617,892 B2 | * | 9/2003 | Krishnamurthy et al. | 327/112 |
| 6,946,904 B1 | * | 9/2005 | Varma et al. | 327/595 |
| 2006/0012402 A1 | * | 1/2006 | Haq | 327/14 |

FOREIGN PATENT DOCUMENTS

EP    1193873 A2    4/2002
WO    WO-2005/011218 A1    2/2005

OTHER PUBLICATIONS

"International Search Report for corresponding PCT Application No. PCT/US2004/011644", (Oct. 21, 2004), 3 pgs.

* cited by examiner

*Primary Examiner*—Ramnandan Singh
(74) *Attorney, Agent, or Firm*—Schwegman, Lundberg & Woessner, P.A.

(57) ABSTRACT

An apparatus comprising a first differential output driver to provide a single ended output voltage in response to an input voltage, a second differential output driver to provide a single ended output in response to the input voltage where the first output voltage and the second output voltage are representative of the positive and inverted input voltage. The apparatus also includes a feedback circuit to monitor the first and second output voltages and apply a bias voltage to at least one of the first and second output drivers to vary the point where the first and second output voltages cross-over as the input voltage changes from a first to a second level.

31 Claims, 10 Drawing Sheets

CROSS-OVER VOLTAGE LOCK FOR DIFFERENTIAL OUTPUT DRIVERS

BACKGROUND

Several types of wire based communication networks exist to provide communication among electronic devices. Many of these networks transmit a differential representation of the data over the network. A differential network uses a transmission cable that has a positive and a negative conductor, and positive and inverted representations of the data are sent on the conductors. A differential signal has the advantage of allowing faster data rates because the differential signals traverse lower voltage swings than single ended signals. Also, the data is less susceptible to noise in a differential signal bus because common mode signal noise picked up on the transmission cable is cancelled by sensing only the difference between the positive and negative conductors of the cable.

One critical parameter in differential signal wire based networks is the differential cross-over voltage of the signal transmitters. The differential cross-over voltage is the point where the voltage at the output of the positive signal transmitter crosses over with the voltage at the output of the negative signal transmitter. To minimize communication errors from power supply noise, electromagnetic interference (EMI), or signal ringing, the cross-over voltage should be at a point equidistant between the maximum and minimum voltages of the outputs. This point is often referred to as mid-rail.

If the network is a wire based serial network, transceivers are used to transmit and receive signals on the same transmission cable. Transmitters of wire based analog transceivers are generally designed with open-loop differential drivers. The drivers are open-loop in that they do not include a feedback mechanism in controlling their output. These transmitters are designed by tuning the cross-over voltage to an optimal mid-rail assuming a nominal process skew and nominal loading on the transmitter outputs. A problem with tuning is that when the transmitter is realized in silicon the cross-over voltage can deviate from the optimal mid-rail value due to undesired process variations or due to asymmetric parasitic off-chip loading. A deviation in the cross-over voltage from the mid-rail voltage value can result in low yield in semiconductor fabrication of the transmitters. A mask iteration may be needed to take into account the non-nominal conditions and to re-tune the cross-over voltage to the mid-rail value.

What is needed is a differential transmitter with a self adjusting cross-over voltage.

BRIEF DESCRIPTION OF THE DRAWINGS

In the drawings like numerals refer to like components throughout the several views.

DETAILED DESCRIPTION

In the following detailed description, reference is made to the accompanying drawings which form a part hereof, and in which is shown by way of illustration specific embodiments in which the invention may be practiced. It is to be understood that other embodiments may be used and structural changes may be made without departing from the scope of the present invention.

This document describes a feedback circuit for use with a differential transceiver that locks the cross-over voltage substantially to a point equidistant between the maximum and minimum voltage of the output of the transceiver transmitter. This equidistant point is often referred to as the mid-rail point.

Figure 1:
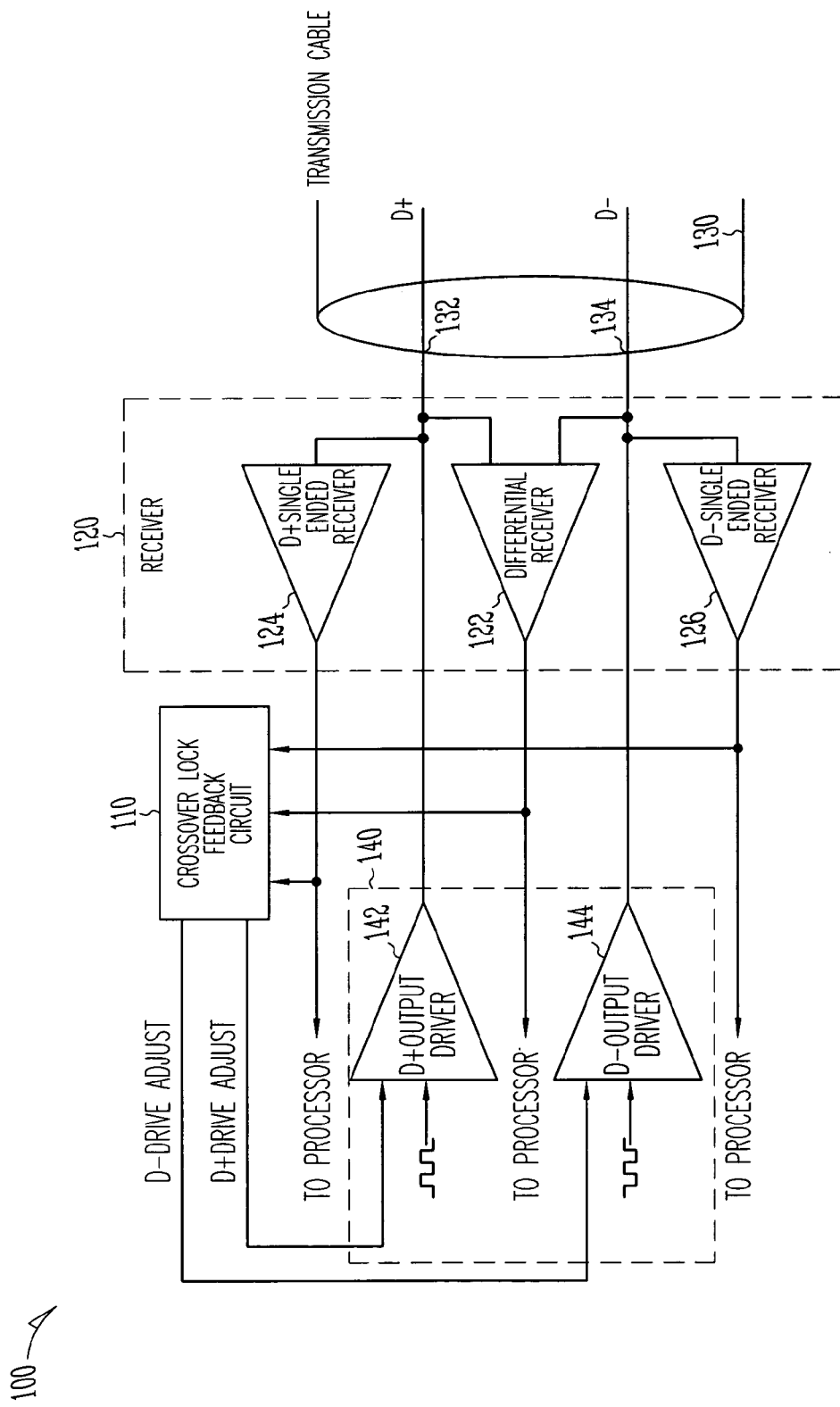
FIG. 1 is a drawing of a serial bus transceiver with an embodiment of a cross-over lock feedback circuit.

FIG. 1 is a drawing of an embodiment of a serial bus transceiver 100 with a cross-over lock feedback circuit 110. The transceiver 100 allows a processor to communicate with other devices connected on the serial bus. The transceiver 100 includes a receiver 120 for receiving signals from a transmission cable 130 comprising a positive conductor 132 (D+) and a negative conductor 134 (D−). The receiver 120 comprises a differential receiver 122, a single ended receiver 124 for the positive conductor 132 (D+) and a single ended receiver 126 for the negative conductor 134 (D−). The single ended receivers 124, 126 detect rail-to-rail transitions on the D+, D− conductors 132, 134 and trip when a voltage threshold on the differential inputs is exceeded. The single-ended receivers 124, 126 are used to detect events such as idle mode or wake-up on the serial bus, and to determine a data transfer rate. The differential receiver 122 detects the incoming data stream and the output trips at the cross-over voltage of the D+, D− conductors 132, 134.

The transceiver 100 also includes a transmitter 140 for transmitting signals on the transmission cable 130. The transmitter 140 comprises a single ended output driver 142 for the positive conductor 132 and a single ended driver 144 for the negative conductor 134. If the transceiver 100 is implemented in CMOS, output drivers 142, 144 are typically designed with PMOS pull-ups and NMOS pull-downs that have equal strength at nominal conditions.

Figure 2A:
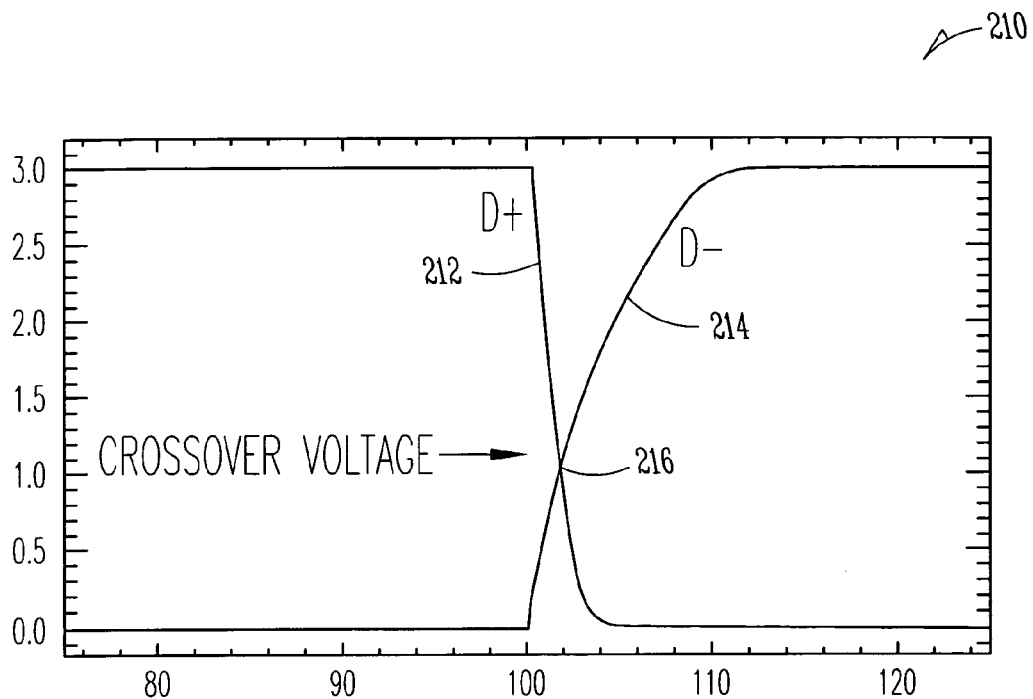
FIG. 2A is a graph showing an output transition of a transceiver with a weak pull-up circuit.

FIG. 2A is a graph 210 showing an output transition of a transceiver 100 with a weak pull-up circuit. In the embodiment shown, the signals transition between a low rail of zero volts and a high rail of three volts. Other values for low and high rails are within contemplation of this application. The D+ conductor 132 is shown transitioning from the high rail to the low rail, and the D− 134 conductor is transitioning from the low rail to the high rail. Because of the mismatch in pull-up rise time and pull-down fall time, a high-to-low signal transition 212 occurs more quickly than a low-to-high signal transition 214. The result is a cross-over voltage point 216 at about one volt instead of the mid-rail 1.5 volts. The differential receiver 122 has high gain and trips at the cross-over point. Because the cross-over point is low, the transceiver is more susceptible to noise on the low rail conductor than if the cross-over point was mid-rail.

Figure 2B:
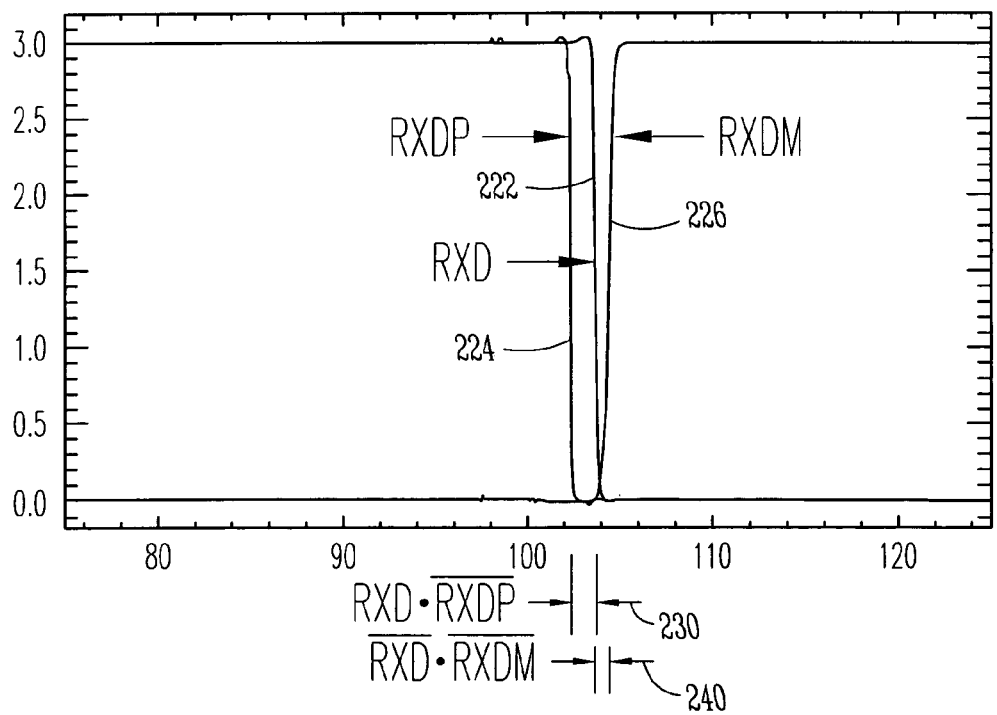
FIG. 2B is a graph showing asymmetry in the transitions of receiver outputs due to the weak pull-up circuit.

FIG. 2B is a graph 220 showing asymmetry in the transitions of receiver outputs 222, 224, 226 due to the weak pull-up circuit. In the embodiment, the output of the differential receiver 222 (RXD) follows the positive logic of the output of the positive single ended receiver 224 (RXDP) which follows the transition of the D+ conductor 132. The output of the negative single ended receiver 226 (RXDM) follows the D− conductor 132. The graph 220 shows the output of the differential receiver 222 (RXD) trips before the output of the negative receiver 226 (RXDM). In the ideal case of a mid-rail cross-over point, the single ended receiver 224, 226 transition points would be coincident or symmetric about the differential receiver 222 output transition point. For the opposite case when the D+ conductor is transitioning from low to high, the output of the positive receiver 224 (RXDP) lags the output of the differential receiver 222 (RXD).

Figure 3A:
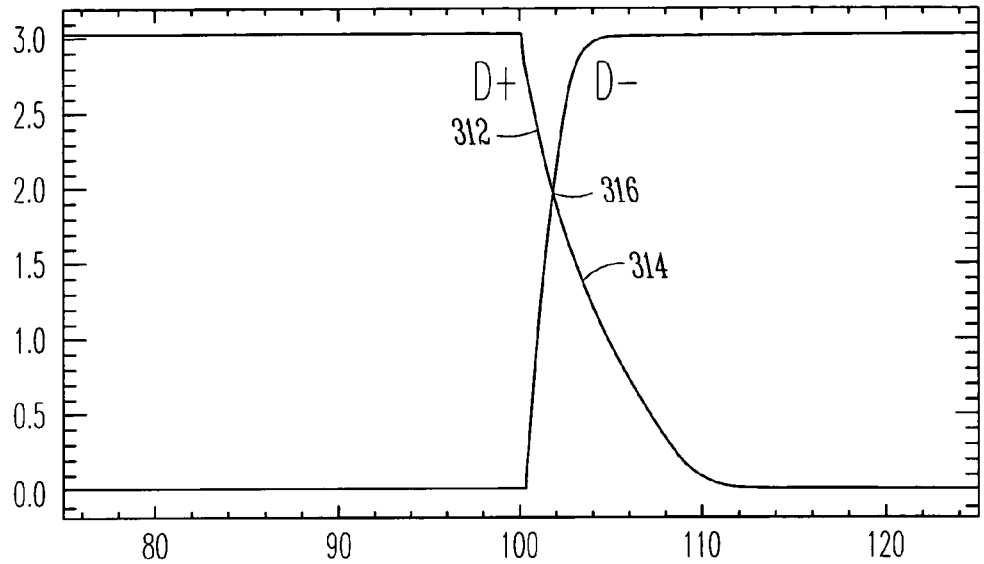
FIG. 3A is a graph showing an output transition of a transceiver with a weak pull-down circuit.
Figure 3B:
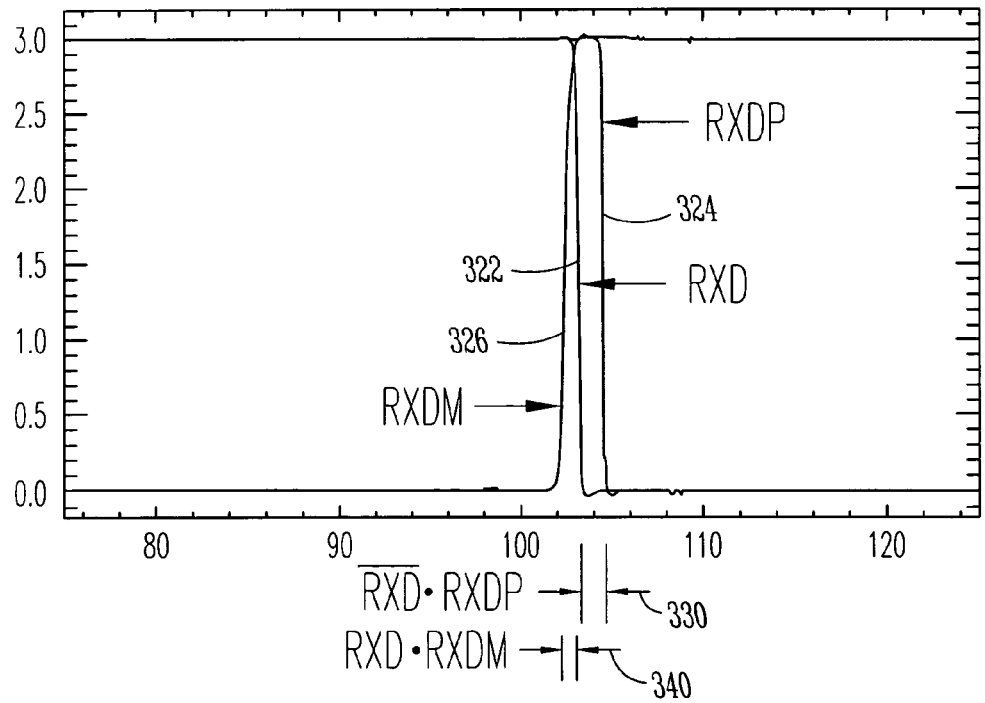
FIG. 3B is a graph showing asymmetry in the transitions of receiver outputs due to the weak pull-down circuit.

FIG. 3A is a graph 310 showing an output transition of a transceiver 100 with a weak pull-down circuit. As in FIG. 2A, the D+ conductor 132 is shown transitioning from the high rail to the low rail, and the D− conductor 134 is transitioning from the low rail to the high rail. This time, the mismatch in rise and fall times causes a cross-over voltage point 316 at about two volts instead of the mid-rail 1.5 volts. Because the cross-over point is high, the transceiver is more susceptible to noise on the high rail conductor. FIG. 3B is a graph 320 showing asymmetry in the transitions of receiver outputs 322, 324, 326 due to the weak pull-down circuit. The graph 320 shows the output of the differential receiver 322 (RXD) trips before the output of the positive receiver 324 (RXDP). For the opposite case when the D+ conductor is transitioning from low to high, the output of the negative receiver 326 (RXDM) lags the output of the differential receiver 322 (RXD).

Figure 4:
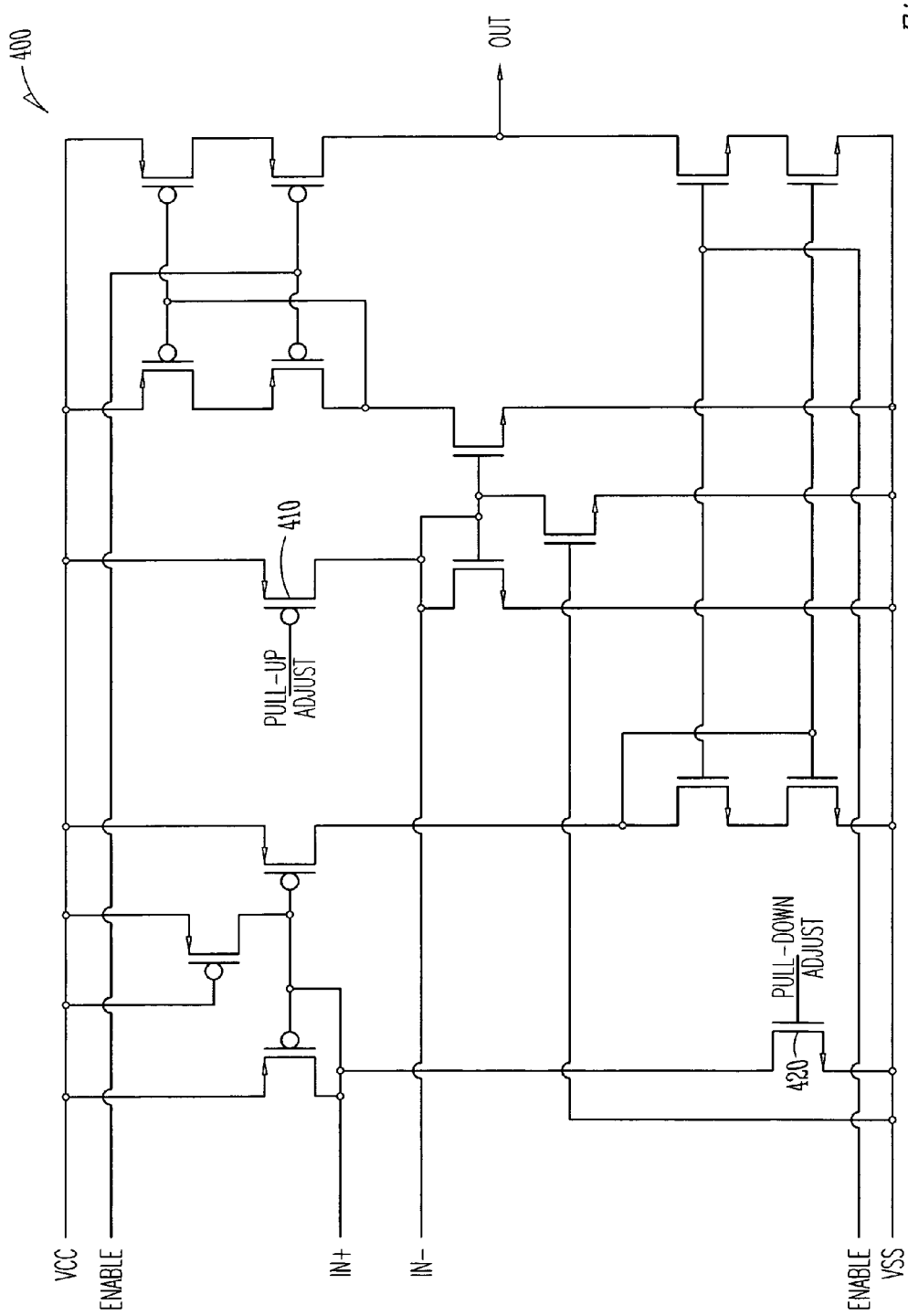
FIG. 4 is a drawing of a single ended driver for a differential transceiver.

To correct the mismatches in rise and fall times, the cross-over feedback lock circuit 110 creates a bias voltage to correct the strength of the pull-down and/or pull-up circuits in the transmitter single ended output drivers 142, 144. An embodiment of a single ended output driver 400 is shown in FIG. 4. Changing the voltage on the gate of PMOS transistor 410 changes the current drive strength of the pull-up bias circuit of the output driver 400. For example, if the voltage of the gate is decreased, the drive strength of the PMOS transistor 410 is increased, and the pull-up is biased toward the high rail (VCC). Conversely, if the gate voltage is increased, the drive strength of the PMOS transistor 410 is decreased, and the pull-up is biased away from the high rail.

Changing the voltage on the gate of NMOS transistor 420 changes the bias of the pull-down of the output driver 400. For example, if the voltage of the gate is increased, the drive strength of the NMOS transistor 420 is increased, and the pull-down is biased toward the low rail (VSS). Conversely, if the gate voltage is decreased, the drive strength of the NMOS transistor 420 is decreased, and the pull-down is biased away from the low rail. Thus, a closed loop system is created by feeding back a voltage to the gates that adjusts the pull-up and/or pull-down biasing by an amount that corrects the mismatch in drive strength.

To create the correcting voltage, a charge is produced based on the output switching time of the differential receiver 122 in relation to the output switching time of the single ended receivers 124, 126. If the cross-over voltage is at mid-rail, the switching is symmetric and no net charge is produced. If the cross-over voltage is not at mid-rail the deviation of the cross-over voltage from a predetermined level results in switching that is asymmetric, and the asymmetry produces a net charge that is converted into a correcting bias voltage for the output drivers 142, 144.

Figure 5:
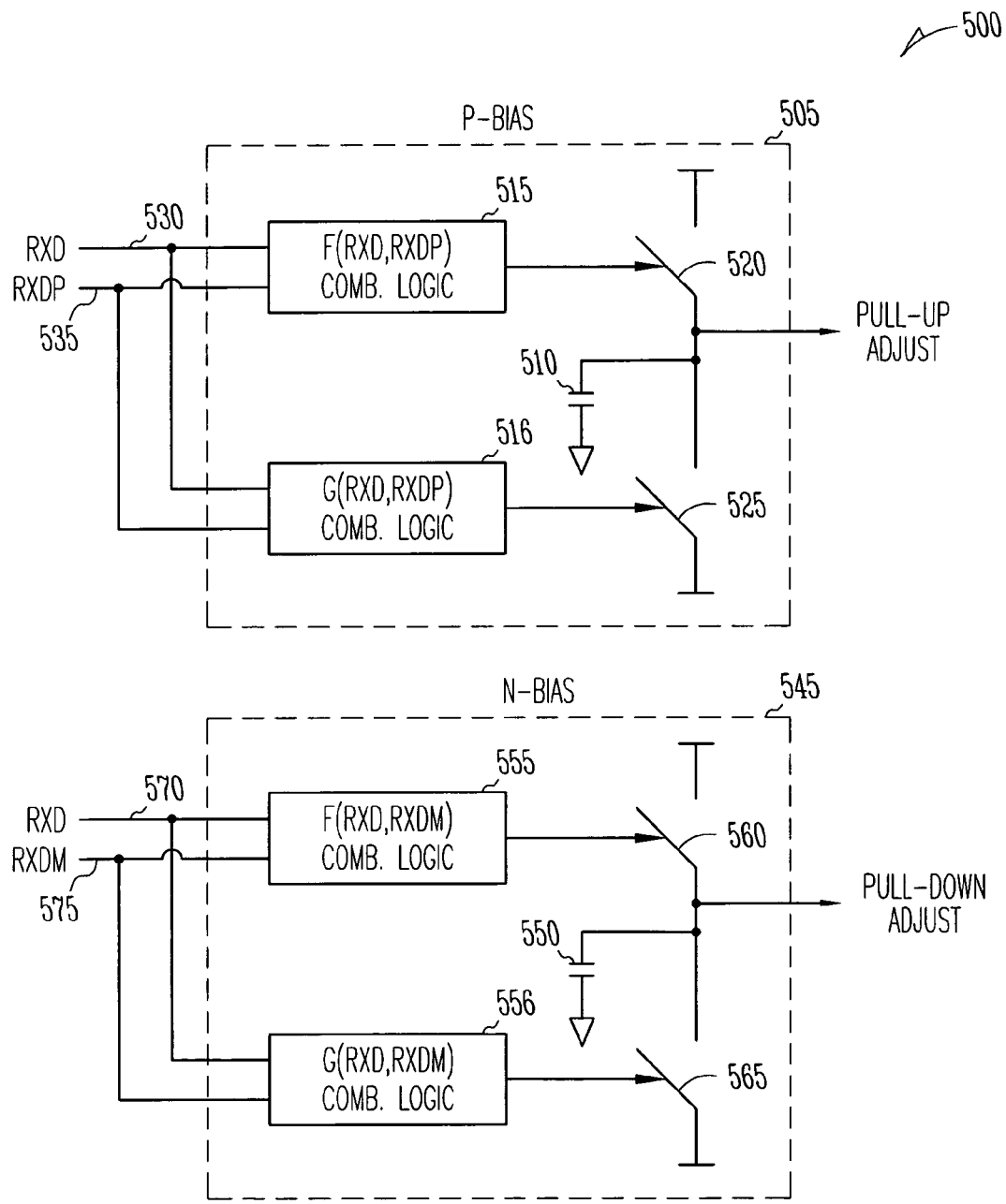
FIG. 5 is a drawing of one embodiment of a switching network used in a cross-over lock feedback circuit.

One embodiment of a switching network 500 to create this charge is shown in FIG. 5. The embodiment comprises a P-bias compensation circuit 505 to compensate the PMOS pull-up circuits of the single ended output drivers 142, 144 and an N-bias compensation circuit 545 to compensate the NMOS pull-down circuits of the single ended output drivers 142, 144. The compensation circuits 505, 545 create a correcting bias voltage by adjusting a charge on a capacitor 510, 550.

For the P-bias circuit 505, combinational logic 515, 516 enables switches 520, 525 to either add charge or remove charge from the capacitor 510 by enabling current to flow to or from the capacitor 510. The switching to enable the current is a function of the states of the outputs of the differential receiver (RXD) 530 and the D+ single ended receiver (RXDP) 535. This function can be expressed as an equation in terms of RXD and RXDP as:

$$I \propto F(\overline{RXD} \cdot RXDP) - G(RXD \cdot \overline{RXDP})$$

If the output of the differential driver 122 lags the output of the D+ single ended receiver 124, the pull-up bias is too strong. The gate voltage of the PMOS transistor 410 of the single ended output drivers 142, 144 is adjusted higher to weaken the pull-up by adding more charge to the capacitor 510 by enabling current to flow through switch 520. Thus, switch 520 is enabled and current is pushed onto capacitor 510 during the time when RXD is low while RXDP is high. The time duration 330 that this logic state of the receivers 122, 124, 126 is valid is shown in FIG. 3B.

If the output of the differential driver 122 leads the output of D+ single ended driver 124, the pull-up bias is too weak. The gate voltage of the PMOS transistor 410 of the single ended output drivers 142, 144 is adjusted lower to strengthen the pull-up by reducing the charge on the capacitor 510 by enabling switch 525. Thus, switch 525 is enabled and drains current from capacitor 520 during the time when RXD is high while RXDP is low. The time duration 230 that this logic state of the receivers 122, 124, 126 is valid is shown in FIG. 2B. Neither switch 520, 525 is enabled while RXD and RXDP are in the same state.

For the N-bias circuit 545, combinational logic 555, 516 enables switches 560, 565 to either add charge or remove charge from the capacitor 550 by allowing current to flow to or from the capacitor 550. The switching to enable the current is a function based on the states of the outputs of the differential receiver (RXD) 570 and the D− single ended receiver (RXDM) 575. This function can be expressed as an equation in terms of RXD and RXDM as:

$$I \propto F(RXD \cdot RXDM) - G(\overline{RXD} \cdot \overline{RXDM})$$

If the output transition of the differential driver 122 lags the output transition of the D− single ended receiver 126, the pull-down bias is too strong. The gate voltage of the NMOS transistor 420 of the single ended output drivers 142, 144 is adjusted lower to weaken the pull-down by reducing charge to the capacitor 550 by enabling switch 565. Thus, in one embodiment switch 565 is enabled and drains current during the time when RXD is low while RXDM is low. This time duration 240 is shown in FIG. 2B.

If the output of the differential driver 122 leads the output of D− single ended driver 126, the pull-down bias is too weak. The gate voltage of the NMOS transistor 420 of the single ended output drivers 142, 144 is adjusted higher to strengthen the pull-up by increasing the charge on the capacitor 550 by enabling switch 560. Thus, in one embodiment switch 560 is enabled during the time when RXD is high while RXDM is high. This time duration 340 is shown in FIG. 3B. Neither switch 560, 565 is enabled while RXD and RXDM are in opposite states.

Figure 6:
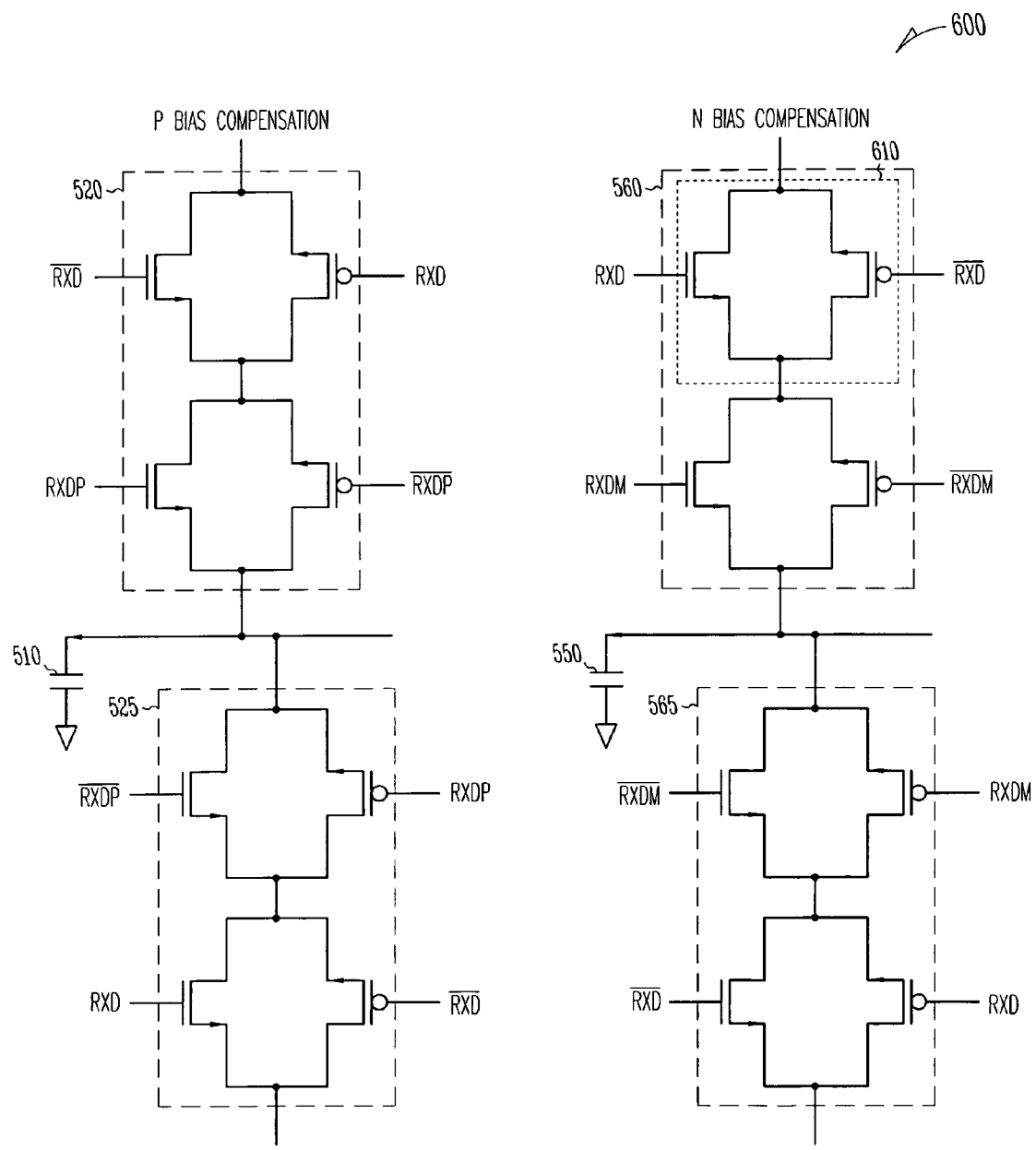
FIG. 6 is a drawing of another embodiment of a switching network used in a cross-over lock feedback circuit.

FIG. 6 shows an embodiment of a switching network using transmission gate, or pass gate, switches 610. The combinational logic is implemented by enabling the pass gate switches 610 in series. For example switch 560 of FIG. 5 is implemented by enabling two pass gate switches with outputs RXD and RXDM. In other embodiments, the combinational logic is implemented with straightforward logic circuits such as and-gates and inverters. One of ordinary skill in the art would understand, upon reading and comprehending this disclosure, that various embodiments of the combinational logic include various combinations of the illustrated circuits and variations of the high and low logic states.

Figure 7A:
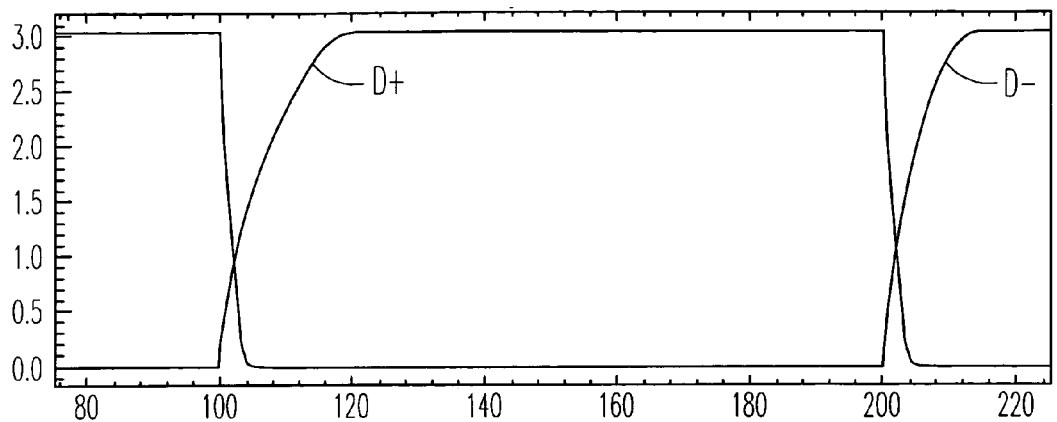
FIG. 7A-C are graphs showing the cross-over lock feedback circuit correcting for weak pull-ups.
Figure 7B:
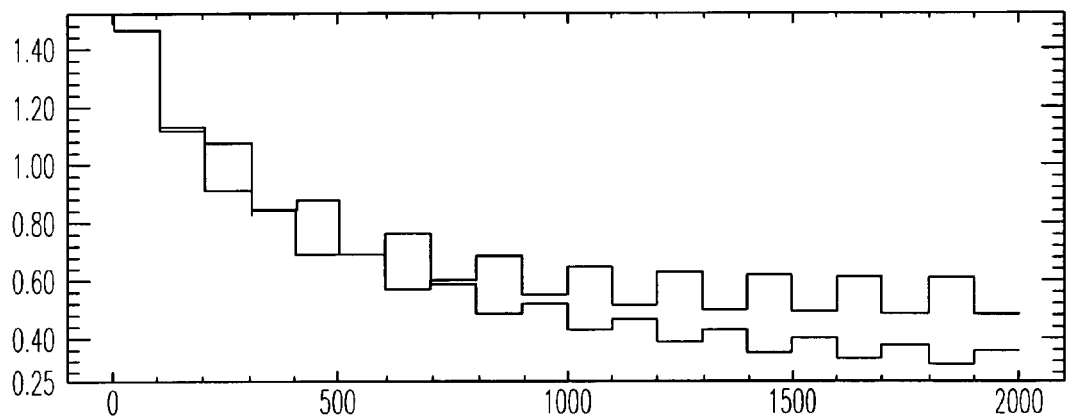
Figure 7C:
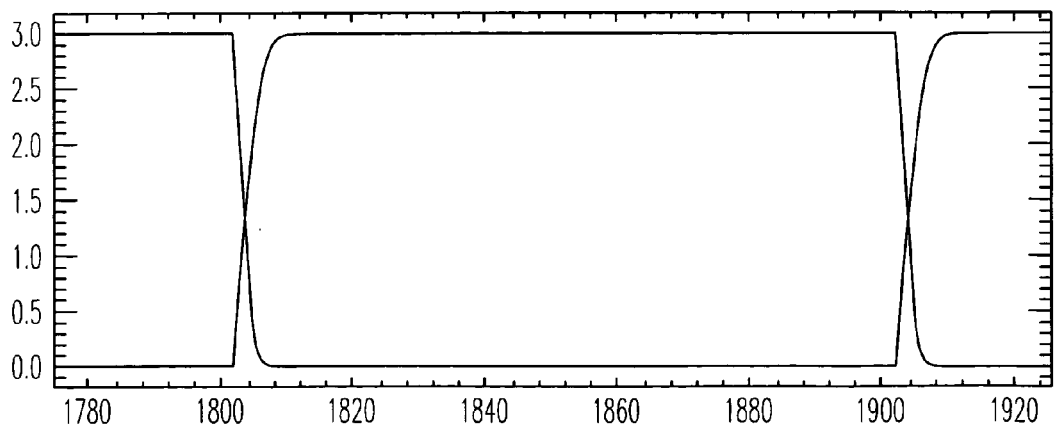

FIG. 7A-C are graphs showing the cross-over lock feedback circuit 110 correcting for weak pull-ups. FIG. 7A shows the initial low crossover voltage (about one volt) on the D+ and D− outputs of the single ended transceiver drivers. FIG. 7B shows the feedback circuit 110 applying a correcting voltage to the transmitter 140 pull-up and pull-down circuits. FIG. 7B also shows that the correcting voltage is adjusted on a clock period basis because the charge is produced from transitions on the transmission cable 130 detected by the receivers 122, 124, 126. After about twenty clock periods, the cross-over voltage is brought back to mid-rail (1.5 Volts) as shown in FIG. 7C.

Figure 8A:
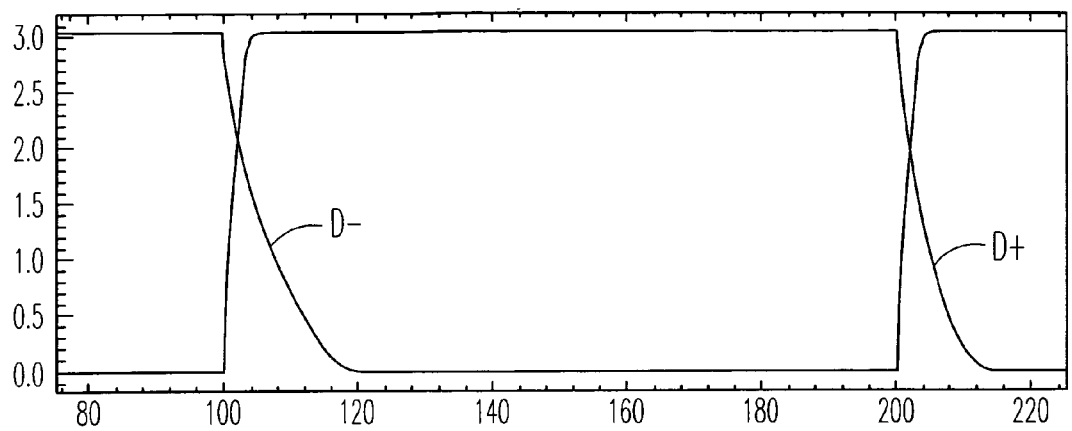
FIG. 8A-C are graphs showing the cross-over lock feedback circuit 110 correcting for weak pull-downs.
Figure 8B:
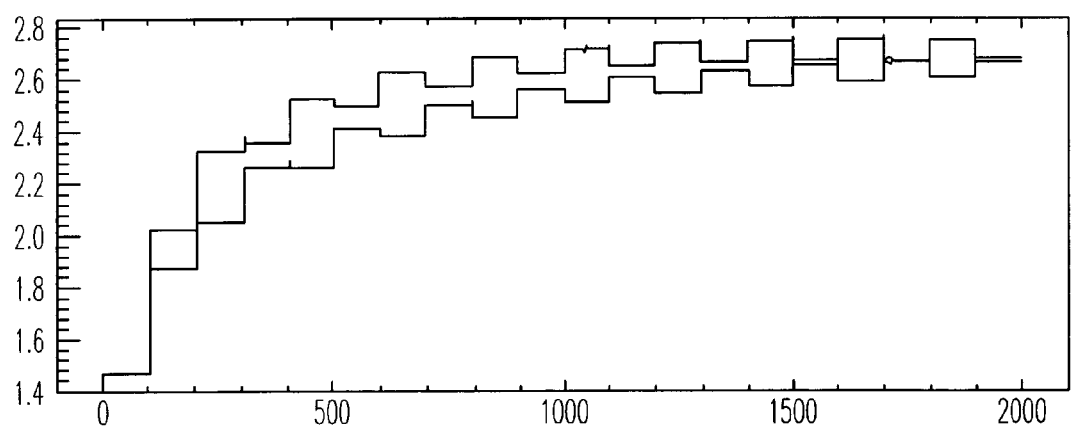
Figure 8C:
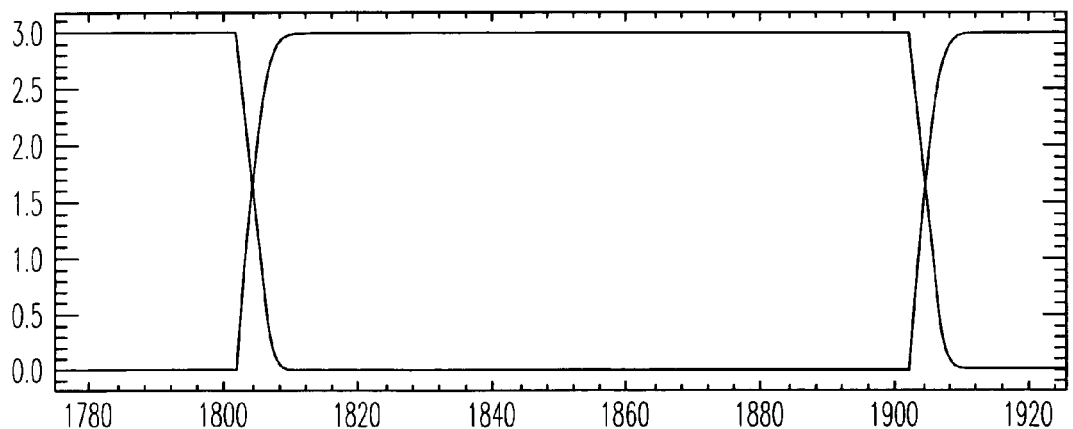

FIG. 8A-C are graphs showing the cross-over lock feedback circuit 110 correcting for weak pull-downs. FIG. 8A shows the initial low crossover voltage is higher than mid-rail (about two volts). FIG. 8B shows the feedback circuit 110 applying a correcting voltage to the transmitter 140 pull-up and pull-down circuits. After about twenty clock periods, the cross-over voltage is brought back to mid-rail (1.5 Volts) as shown in FIG. 8C.

Figure 9:
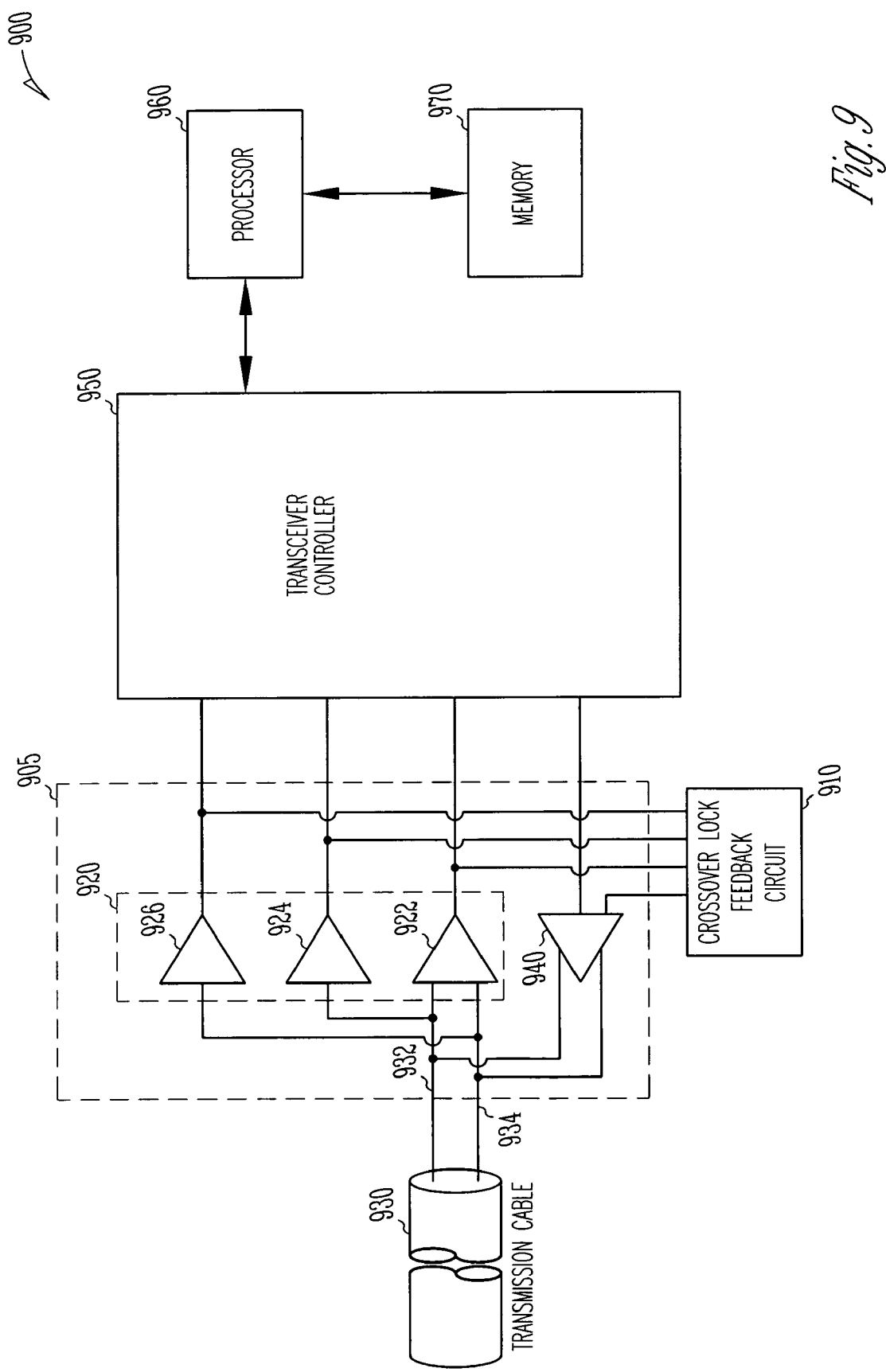
FIG. 9 is a drawing of a system using a differential transceiver to communicate over a transmission cable.

FIG. 9 is a drawing of a system 900 that uses a differential transceiver interface 905 to communicate over a transmission cable 930. System 900 includes receiver 920, driver 940, processor 960, memory 970, transceiver controller 950 and crossover feedback lock circuit 910. Receiver 920 includes single ended receivers 924, 926 and differential receiver 922 to detect signals on nodes 932, 934. Differential driver 940 includes a single ended driver for node 932 and single ended driver for node 934. Crossover lock feedback circuit 910 corrects deviations of the cross-over voltage on transmission cable 930 from a point equidistant between the maximum and minimum output voltages of driver 940.

Transceiver controller 950 communicates with other devices connected to node 932, 934 by transmitting data on driver 940 and receiving data on receiver 920. The transceiver controller 950 also communicates with microprocessor 960 and memory 970. The transceiver controller 950 can be any type of transceiver controller suitable for communication with the transceiver interface 905. For example, transceiver controller 950 may be a universal serial bus, a synchronous optical network (SONET), a Firewire controller, or the like.

Processor 960 can be any type of processor suitable for operation with the system 900. For example, in various embodiments of the system 900, processor 960 is a microprocessor, a microcontroller or the like. Memory 970 represents an article that includes a machine accessible medium. For example, memory 970 may represent any one or a combination of the following: a hard disk, a floppy disk, random access memory (RAM), read only memory (ROM), flash memory, CDROM, or any other type of article that includes a medium readable by a machine.

Systems represented by the foregoing figures can be of any type. Examples of represented systems include computers (e.g., desktops, laptops, notebooks, handhelds, servers, Web appliances, routers, etc.), wireless communication devices (e.g., cellular phones, cordless phones, pagers, personal data assistants, etc.), computer-related peripherals (e.g., printers, scanners, monitors, etc.), entertainment devices (e.g., televisions, radios, stereos, tape and compact disc players, video cassette recorders, digital video disc players, camcorders, digital cameras, MP3 (Motion Picture Experts Group, Audio Layer 3) players, video games, watches, etc.), and the like.

Transmission cable 930 can be any type of two conductor cable suitable for operation with the system 900. For example, in various embodiments of the system, transmission cable 930 is a coaxial cable, a twisted pair cable, and the like.

Figure 10:
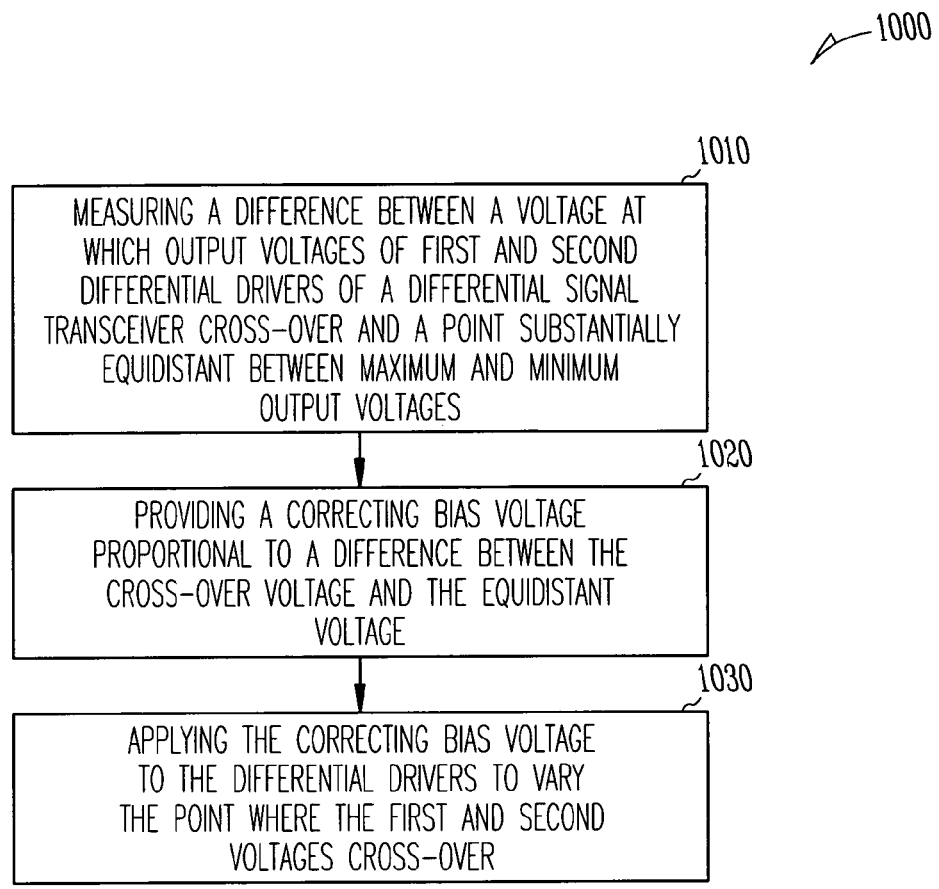
FIG. 10 is a flow chart of a method of providing a mid-rail cross-over voltage for a differential transceiver.

FIG. 10 is a flow chart of a method 1000 of providing a mid-rail cross-over voltage for a differential transceiver. At 1010, a difference is measured between a voltage at which output voltages of first and second differential drivers of a differential signal transceiver cross-over and a point substantially equidistant between maximum and minimum output voltages. At 1020, a correcting bias voltage is provided that is proportional to a difference between the cross-over voltage and the equidistant voltage. At 1030, the correcting bias voltage is applied to the differential drivers to vary the point where the first and second output voltages cross-over.

Although specific examples have been illustrated and described herein, it will be appreciated by those of ordinary skill in the art that any arrangement calculated to achieve the same purpose could be substituted for the specific example shown. This application is intended to cover any adaptations or variations of the present invention. Therefore, it is intended that this invention be limited only by the claims and the equivalents shown.

What is claimed is:

1. An apparatus comprising:
a first differential output driver to provide a single ended output voltage in response to an input voltage;
a second differential output driver to provide a single ended output in response to the input voltage, the first output voltage and the second output voltage representative of the positive and inverted input voltage; and
a feedback circuit to monitor the first and second output voltages and apply a bias voltage to at least one of the first and second output drivers to vary the point where the first and second output voltages cross-over as the input voltage changes from a first to a second level, wherein the bias voltage is a function of a mismatch in transition times between the first and second output voltages.

2. The apparatus of claim 1, wherein the correcting bias voltage forces the first and second output voltages to cross-over at a point substantially equidistant between maximum and minimum output voltages of the first and second differential drivers.

3. The apparatus of claim 2, wherein the feedback circuit further includes at least one capacitor, and wherein the feedback circuit places a charge proportional to a difference between an actual cross-over voltage of the first and second output drivers and the equidistant cross-over voltage onto the capacitor to convert the charge into the correcting voltage.

4. The apparatus of claim 3, wherein the at least one capacitor includes a first and second capacitor, wherein the feedback circuit places a charge proportional to a difference between the actual cross-over voltage and the equidistant cross-over voltage onto the first and second capacitors, and wherein the first capacitor supplies a correcting voltage to at least one pull-up bias circuit in the output drivers, and the second capacitor supplies a correcting voltage to at least one pull down bias circuit in the output drivers.

5. The apparatus of claim 4, wherein the feedback circuit applies the correcting voltage to increase a drive strength of the pull-up bias circuit and/or to decrease a drive strength of the pull-down bias circuit if the actual cross-over voltage is lower than the equidistant cross-over voltage.

6. The apparatus of claim 4, wherein the feedback circuit applies the correcting voltage to decrease a drive strength of the pull-up bias circuit and/or to increase the pull-down bias circuit if the cross-over voltage is higher than the equidistant cross-over voltage.

7. The apparatus of claim 4, further including:
a differential receiver for detecting a cross-over voltage transition on the differential interface, the differential receiver having a first output;
a single-ended receiver for detecting rail-to-rail transitions on the positive conductor, the receiver for the positive conductor having a second output;
a single-ended receiver for detecting rail-to-rail transitions on the negative conductor, the receiver for the negative conductor having a third output; and
wherein if the cross-over voltage is lower than the equidistant voltage, charge on the first capacitor is reduced while the first output is high and the second output is low and/or charge on the second capacitor is reduced while the first output is low and the third output is low.

8. The apparatus of claim 7,
wherein if the cross-over voltage is higher than the equidistant voltage, charge on the first capacitor is increased while the first output is low and the second output is high and/or charge on the second capacitor is increased while the first output is high and the third output is high.

9. The apparatus of claim 7, wherein the outputs enable switches to apply a high voltage level to the first and second capacitors to increase the charge, and to apply a low voltage level to the first and second capacitors to reduce the charge.

10. The apparatus of claim 9, wherein the switches include transmission-gate switches.

11. The apparatus of claim 3, wherein the first capacitor provides a correcting voltage to a gate of a PMOS transistor in the pull-up bias circuit, and wherein the second capacitor provides a correcting voltage to a gate of an NMOS transistor in the pull-down bias circuit.

12. The apparatus of claim 1, wherein the first and second output drivers are connected to provide positive and negative outputs to positive and negative conductors of a transmission cable.

13. The apparatus of claim 1, wherein the transceiver circuit is an interface to a universal serial bus (USB).

14. A method comprising:
measuring a difference between a voltage at which output voltage signals of first and second drivers of a differential signal transceiver cross-over and a voltage point substantially equidistant between maximum and minimum output voltages;
providing a correcting bias voltage proportional to a difference between switching times of the first and second output voltages; and
applying the correcting bias voltage to the differential drivers to vary the voltage point where the first and second output voltages cross-over.

15. The method of claim 14, wherein providing a correcting bias voltage includes:
producing a net charge on at least one capacitor in proportion to the difference between the cross-over voltage and the equidistant voltage; and
converting the charge into a correcting bias voltage.

16. The method of claim 15, wherein the net charge produced is zero when the cross-over voltage matches the equidistant voltage.

17. The method of claim 15, wherein the at least one capacitor includes a first and second capacitor and producing a charge on a capacitor includes switching a power supply rail onto the first and second capacitor.

18. The method of claim 17, wherein adjusting a pull-up circuit bias includes applying a correcting voltage on the first capacitor to adjust a pull-up bias voltage, and adjusting a pull-down circuit bias includes applying a correcting voltage on the second capacitor to adjust a pull-down capacitor voltage.

19. The method of claim 15, wherein measuring further includes:
measuring a cross-over transition on positive and negative conductors of a transmission cable with the differential signal transceiver;
measuring a rail-to-rail transition on the positive conductor of the transmission cable; measuring a rail-to-rail transition on the negative conductor of the transmission cable; and
wherein producing a net charge includes switching a charge onto the capacitor when there is a mismatch in transition times.

20. The method of claim 19, wherein measuring further includes:
providing a single ended output transition on a differential receiver in response to the cross-over transition;
providing a single ended output transition on an output of a first single ended receiver in response to a transition exceeding a first voltage threshold on the positive conductor; and providing a single ended output transition on an output of a second single ended receiver in response to a transition exceeding a second voltage threshold on the negative conductor.

21. The method of claim 20, wherein providing the single ended output transition of the differential receiver includes providing a transition that follows the transition on the positive conductor, and wherein switching includes:
a) switching a low supply onto the first capacitor while an output of the differential receiver is at a high voltage and an output of the first single-ended receiver is at a low voltage;
b) switching a high supply onto the first capacitor while the output of the differential receiver is at a low voltage and the output of the first single-ended receiver is at a high voltage;
c) switching a low supply onto the second capacitor while the output of the differential receiver is at a low voltage and an output of the second single-ended receiver is at a low voltage; and
d) switching a high supply onto the second capacitor while the output of the differential receiver is at a high voltage and the output of the second single-ended receiver is at a high voltage.

22. The method of claim 14, wherein applying the correcting bias voltage to the differential drivers includes feeding back the correcting voltage to the drivers to adjust a drive strength of pull-up and pull-down bias circuits.

23. The method of claim 22, wherein adjusting the drive strength of pull-up and pull-down circuit biasing includes:
increasing the drive strength of the pull-up bias circuit and/or decreasing the drive strength of the pull-down bias circuit if the cross-over voltage is lower than the equidistant voltage; and
decreasing the drive strength of the pull-up bias circuit and/or increasing the drive strength of the pull-down bias circuit if the cross-over voltage is higher than the equidistant voltage.

24. The method of claim 23, wherein
increasing the drive strength of the pull-up bias circuit includes decreasing a gate voltage on a PMOS transistor,
decreasing the drive strength of the pull-up bias circuit includes increasing a gate voltage of the PMOS transistor,
increasing a drive strength of the pull-down bias circuit includes increasing a gate voltage on an NMOS transistor, and
decreasing the drive strength of the pull-down bias circuit includes decreasing a gate voltage on the NMOS transistor.

25. A system comprising:
a transceiver interface coupled to a differential communication bus, the transceiver interface including a positive conductor and a negative conductor and having a differential cross-over voltage of a magnitude between high and low transceiver output;
a transceiver controller in communication with the transceiver interface; and
a cross-over lock feedback circuit to correct deviations of the cross-over voltage from a voltage point equidistant between maximum and minimum output voltages of the transceiver, wherein the cross-over lock feedback circuit generates a correcting voltage as a function of a mismatch in switching times between the positive conductor and the negative conductor.

26. The system of claim 25, wherein the transceiver interface further includes at least one transceiver driver coupled to the cross-over lock feedback circuit, the driver having pull-up and pull-down circuits; and wherein the feedback circuit feeds back the correcting voltage to the driver to adjust the pull-up and/or pull-down of the driver to correct the cross-over voltage.

27. The system of claim 26, wherein the cross-over lock feedback circuit produces a charge in proportion to a difference of the cross-over voltage from the equidistant voltage to provide the correcting voltage.

28. The system of claim 27, wherein the transceiver interface further includes:
a differential receiver;
a single-ended receiver coupled to a positive node on the differential bus; and
a single-ended receiver coupled to a negative node on the differential bus, wherein the feedback circuit produces a charge based on asymmetry of switching times at receiver outputs when the cross-over voltage is different from the midpoint voltage.

29. A system comprising:
a transceiver interface coupled to a differential communication bus, the transceiver interface including a positive conductor and a negative conductor and having a differential cross-over voltage of a magnitude between high and low transceiver output voltages;
a transceiver controller in communication with the transceiver interface; and
a cross-over lock feedback circuit to correct deviations of the cross-over voltage from a voltage point equidistant between maximum and minimum output voltages of the transceiver, wherein the cross-over lock feedback circuit generates a correcting voltage as a function of a mismatch in switching times between the positive conductor and a negative conductor;
a processor in communication with the transceiver controller; and
a DRAM memory in communication with the processor.

30. The system of claim 29, wherein the transceiver interface further includes at least one transceiver driver coupled to the cross-over lock feedback circuit, the driver having pull-up and pull-down circuits; and wherein the feedback circuit feeds back the correcting voltage to the driver to adjust the pull-up and/or pull-down of the driver to correct the cross-over voltage.

31. The system of claim 30, wherein the cross-over lock feedback circuit produces a charge in proportion to a difference of the cross-over voltage from the equidistant voltage to provide the correcting voltage.

* * * * *